US006356382B1

(12) United States Patent
Nakano et al.

(10) Patent No.: US 6,356,382 B1
(45) Date of Patent: Mar. 12, 2002

(54) OPTICAL WAVELENGTH CONVERTER WITH ACTIVE WAVEGUIDE

(75) Inventors: Yoshiaki Nakano; Byong-Jin Ma, both of Tokyo (JP)

(73) Assignee: The University of Tokyo, Tokyo (JP)

( * ) Notice: Subject to any disclaimer, the term of this patent is extended or adjusted under 35 U.S.C. 154(b) by 0 days.

(21) Appl. No.: 09/276,925

(22) Filed: Mar. 26, 1999

(30) Foreign Application Priority Data

Sep. 28, 1998 (JP) .......................................... 10-273435

(51) Int. Cl.⁷ ............................................... G02F 1/365
(52) U.S. Cl. ...................... 359/332; 359/326; 359/344; 385/122
(58) Field of Search ................................ 359/326–332, 359/344; 385/122; 372/21, 22

(56) References Cited

U.S. PATENT DOCUMENTS

| 5,673,140 A | * | 9/1997 | Fisher | 359/332 |
| 5,978,129 A | * | 11/1999 | Jourdan et al. | 359/326 |
| 6,005,708 A | * | 12/1999 | Leclerc et al. | 359/326 |
| 6,040,938 A | * | 3/2000 | Ducellier | 359/344 |
| 6,046,841 A | * | 4/2000 | Mahgerefteh et al. | 359/326 |
| 6,101,027 A | * | 8/2000 | Lee et al. | 359/344 |

FOREIGN PATENT DOCUMENTS

JP          10-319454       * 12/1998

OTHER PUBLICATIONS

English Translation of: Ma et al, "Proposal And Analysis Of A Novel Wavelength Converter Based On Codirectionally–Coupled Semiconductor Optical Amplifiers", Shingaku Giho [Technical Report of IEICE], vol. 98, No. 187, pp. 37–42, Jul. 1998.*

"Proposal and analysis of a novel wavelength converter based on codirectionally–coupled semiconductor optical amplifiers" Ma et al., The Institute of Electronics, Information and Communication Engineers, Technical Report OCS98–33, PS98–25, Jul. 1998.

* cited by examiner

Primary Examiner—John D. Lee
(74) Attorney, Agent, or Firm—Venable; Robert J. Frank

(57) ABSTRACT

An optical wavelength converter, including first and second semiconductor optical amplifiers, in which an input optical pulse signal having a first wavelength $\lambda_1$ and a non-modulated optical signal having a second wavelength $\lambda_2$ are made incident upon the first semiconductor optical amplifier. Propagation constants of the first and second semiconductor optical amplifiers are determined such that a propagation constant difference $\Delta\beta$ between the first and the second semiconductor optical amplifiers when only the optical signal having the second wavelength $\lambda_2$ propagates along the first semiconductor optical amplifier is smaller than a propagation constant difference $\Delta\beta$ when both the input optical pulse signal and non-modulated optical signal propagate along the first semiconductor optical amplifier. During a lower power level of the input optical pulse signal, an amplified optical output signal having the second wavelength $\lambda_2$ emanates from the second semiconductor optical amplifier due to the optical coupling, but during a higher power level of the input optical pulse signal, the optical coupling between the first and second waveguides is substantially released and no optical signal is emitted from the second semiconductor optical amplifier.

11 Claims, 3 Drawing Sheets

OPTICAL WAVELENGTH CONVERTER WITH ACTIVE WAVEGUIDE

BACKGROUND OF THE INVENTION

1. Field of the Invention

The present invention relates to an optical wavelength converter for converting an input optical pulse signal having a first wavelength into an output optical pulse signal having a second wavelength which is different from said first wavelength.

2. Description of the Related Art

Such an optical wavelength converter can be preferably used as a resource in the wavelength division multiplex (WDM) optical communication system. In accordance with recent abrupt progress in digital communication systems, the development of the WDM optical communication system has been strongly required. This WDM optical communication system requires an optical wavelength converter in order to utilize channels in an efficient manner by channel switching. Such an optical wavelength converter has been known. For instance, a XGM type optical wavelength converter utilizing cross gain modulation has been proposed. In the XGM type optical wavelength converter, an intensity-modulated input optical signal having a wavelength $\lambda_1$ and an optical signal having a wavelength $\lambda_2$ and a constant amplitude are supplied to a semiconductor optical amplifier, and a polarity-inverted output optical signal having a wavelength $\lambda_2$ is produced by utilizing a difference in gain for optical power impinging upon the semiconductor optical amplifier.

There has been further proposed a XPM optical type optical wavelength converter. A conventional type optical wavelength converter utilizes the principle of the Mach-Zehnder type interferometer.

In the XPM optical wavelength converter, an input side waveguide upon which an input optical signal having a wavelength $\lambda_1$ is divided into two waveguides, a semiconductor optical amplifier is arranged in one of the waveguides, and these two waveguides are set to be in-phase for light having a wavelength $\lambda_2$ to be modulated. When an input optical signal having a wavelength $\lambda_1$ and an optical signal having a wavelength $\lambda_2$ and a constant amplitude propagate, there is produced a phase difference of a half wavelength between the two waveguides due to the function of the input optical signal. By utilizing this phase difference, an inverted optical output having the wavelength $\lambda_2$ is generated.

In the known XGM type optical wavelength converter, the output optical signal having a wavelength $\lambda_2$ produced in response to the input optical signal having a wavelength $\lambda_1$ has a rather small gain. Therefore, a zero level of the output optical signal deviates from a real zero. Consequently, the extinction ratio of this optical wavelength converter is small.

In the above mentioned XPM type optical wavelength converter, although it is possible to obtain a sufficiently large extinction ratio, since it reveals a periodical response, an extremely larger tolerance is required for the device length. Therefore, a through-put of the known XPM type optical wavelength converter.

Furthermore, the above mentioned known optical wavelength converter is relatively large in size. That is to say, the typical size of the known optical wavelength converter is not smaller than several to ten millimeters, and thus it is practically difficult to integrate it as a single chip.

SUMMARY OF THE INVENTION

The present invention has for its object to provide a novel and useful optical wavelength converter which can avoid or at least mitigate the above explained problems of the known optical wavelength converters and can have a large extinction ratio, can operate even in a digital fashion, and can be manufactured easily.

It is another object of the invention to provide an optical wavelength converter which can be small in size and can be integrated as a single chip.

According to the invention, an optical wavelength converter for converting an input optical pulse signal having a first wavelength into an output optical pulse signal having a second wavelength which is different from said first wavelength comprises:

a first waveguide constructed by an active waveguide and receiving the input optical signal having the first wavelength, a propagation constant of said first waveguide being changed in accordance with the input optical signal; and a second waveguide arranged in parallel with said first waveguide to partially overlap with said first waveguide such that the first and second waveguides are optically coupled with each other to such an extent that evanescent light of light propagating along one of the first and second waveguides extends into the other waveguide;

wherein said first and second waveguides have a waveguide length L which is substantially equal to a coupling length at which a power transition of an optical signal propagating along the first waveguide into the second waveguide becomes maximum; and said first and second waveguides are constructed such that a propagation constant difference $\Delta\beta$ between the first and the second waveguides in a case that only an optical signal having the second wavelength propagates along said first waveguide is smaller than a propagation constant difference $\Delta\beta$ between the first and the second waveguides when both the input optical signal having the first wavelength and the optical signal having the second wavelength propagate along the first waveguide.

According to the invention, said optically coupled first and second waveguides are arranged in parallel with each other and are constructed such that the waveguide length of these first and second waveguides becomes equal to the coupling length. Then, the two waveguides are coupled with each other and constitute an optical coupler in which a light wave propagating along one of the waveguides can be transferred or shifted into the other waveguide. In this case, a transition ratio of optical power is dependent not only upon the waveguide length, but also upon a difference in a propagation constant difference $\Delta\beta$ between these two waveguides. When the propagation constant difference $\Delta\beta$ decreases, the optical power transition ratio becomes high, and when the propagation constant difference $\Delta\beta$ is increased, the optical power transition ratio becomes extremely small. Under a given condition, the optical power transition ratio can be substantially zero. Therefore, by controlling the propagation constant difference $\Delta\beta$ between the two waveguides, it is possible to control the condition of the optical coupling between the waveguides in a digital fashion. The present invention is based on such a recognition and at least one of the two waveguides is constructed by the active waveguide in which the propagation constant is changed in accordance with the input optical signal. Therefore, by controlling the propagation constant of the active waveguide, the propagation constant difference $\Delta\beta$ between the waveguides can be adjusted to control the optical coupling condition between the waveguides.

According to the invention, the active waveguide may be constructed by a semiconductor optical amplifier. In the semi-conductor optical amplifier, the refractive index of an active layer is changed in accordance with the amount of carriers which are injected into the active layer and are stored therein. When the optical power of the input optical signal is high, the amount of carriers which are consumed by the amplifying function becomes large and the amount of carriers stored in the active layer is decreased, and therefore the refractive index of the waveguide is relatively increased. Contrary to this, when the optical power of the input optical signal is low, the amount of consumed carriers is decreased and the amount of carriers stored in the active layer is relatively increased, and thus the refractive index is decreased. When the refractive index of the waveguide is changed, the propagation constant of the waveguide is also changed. According to the invention, such an active function of the semiconductor optical amplifier is utilized to control the propagation constant of the waveguide through the change in the refractive index of the waveguide in accordance with the optical power of the input optical signal. That is to say, the externally supplied optical signal can be effectively used as a control signal for controlling the propagation constant of the waveguide. When the input optical signal is of an optical pulse signal, the refractive index of the waveguide is relatively decreased during a lower level period of the pulse and is relatively increased during a higher level period of the pulse. In this manner, the refractive index of the waveguide is changed in accordance with a power level of the input optical pulse signal and the propagation constant of the waveguide is also changed. Therefore, the optical coupling condition between the two waveguides can be adjusted in a digital fashion in accordance with the lower and higher power levels of the input optical pulse signal.

According to an aspect of the invention, the input optical pulse signal having the first wavelength $\lambda_2$ which is to be converted is made incident upon the first waveguide together with a non-modulated optical signal having the second wavelength $\lambda_2$, and the propagation constants of the first and second waveguides are determined such that a propagation constant difference $\Delta\beta$ between the first and the second waveguides when only the optical signal having the second wavelength $\lambda_2$ propagates along said first waveguide is smaller than a propagation constant difference $\Delta\beta$ between the first and the second waveguides when both the input optical pulse signal having the first wavelength $\lambda_1$ and the non-modulated optical signal having the second wavelength $\lambda_2$ propagate along the first waveguide. Then, during a lower power level of the input optical pulse signal, the optical signal having the second wavelength is emitted from the second waveguide with a higher power level. However, during a higher power level of the input optical pulse signal, the optical coupling between the first and second waveguides is released and no optical signal is emitted from the second waveguide. That is to say, in this case, the output optical signal has a lower power level. In this manner, an inverted optical output signal having the second wavelength emanates from the second waveguide.

According to the invention, it is not always necessary that the two waveguides are constructed by the active waveguide, but at least one of the two waveguides upon which the input optical signal is made incident is constructed by the active waveguide. For instance, the first waveguide is constructed by the active waveguide and the second waveguide may be constructed by the passive waveguide. Furthermore, both the first and second waveguides may be constructed by the active waveguide When the first waveguide is constructed such that a propagation constant difference $\Delta\beta$ between the first and the second waveguides in a case that only the optical signal having the second wavelength propagates along said first waveguide becomes substantially zero, the waveguide length L becomes equal to the complete coupling length, and therefore the optical wavelength converter has a high conversion efficiency.

In a preferable embodiment of the optical wavelength converter according to the invention, said first and second waveguides are constructed by first and second semiconductor optical amplifiers, respectively which are formed on a same substrate. In this embodiment, the first and second optical amplifiers having substantially identical propagation constants can be manufactured on the same substrate by means of the well developed semiconductor manufacturing process.

In another preferable embodiment of the optical wavelength converter according to the invention, each of the first and second semiconductor optical amplifiers is formed to have the waveguide length within a range from 100 $\mu$m to 5 mm. It is desirable that the waveguide length of the semiconductor optical amplifier is substantially identical with the coupling length. However, the coupling length could not be determined at will, but depends on, for instance the distance between the waveguides and the amount of injected current. If the waveguide length is not larger than 100 $\mu$m, the two waveguides have to be coupled along a short distance, and thus the distance between these waveguides has to be decreased. It is apparent that such a structure could not be easily manufactured and the manufacturing yield might be decreased. Moreover, the amount of the injected current has to be increased. If the waveguide length is not smaller than 5 mm, the whole assembly might be large in size, and the second optical signal having the second wavelength $\lambda_2$ might be subjected to external influences and the control of the coupling condition could be performed only with difficulty. Therefore, according to the invention, the waveguide length is preferably set to 100 $\mu$m–5 mm.

In another preferable embodiment of the optical wavelength converter according to the invention, a DC bias current source is connected across first and second electrodes of at least one of the first and second semiconductor optical amplifiers. By adjusting the DC bias current, the propagation constant difference between the two waveguides can be controlled. Although the two semiconductor optical amplifiers are formed on a same substrate using the well developed semiconductor device, it is sometimes difficult to make the propagation constants of the optical amplifiers identical with each other. In such a case, it is very effective to provide means for controlling the propagation constant difference. The refractive index of the waveguide can be adjusted by controlling the amount of an electric current injected into the waveguide, and therefore the propagation constant difference can be controlled by adjusting the bias current.

DESCRIPTION OF THE PREFERRED EMBODIMENT

Figure 1:
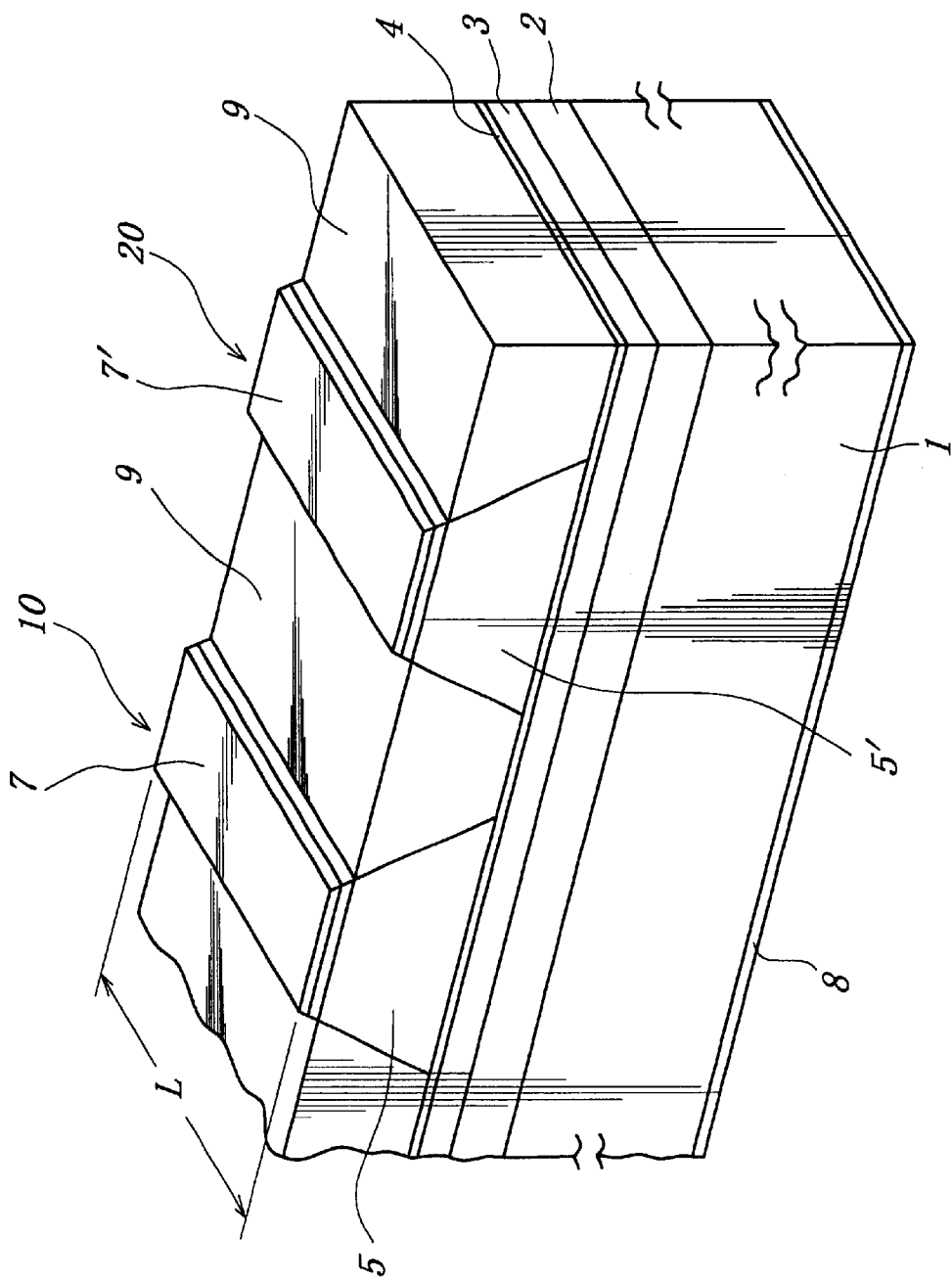
FIG. 1 is a schematic perspective view showing an embodiment of the optical wavelength converter according to the invention.
Figure 2:
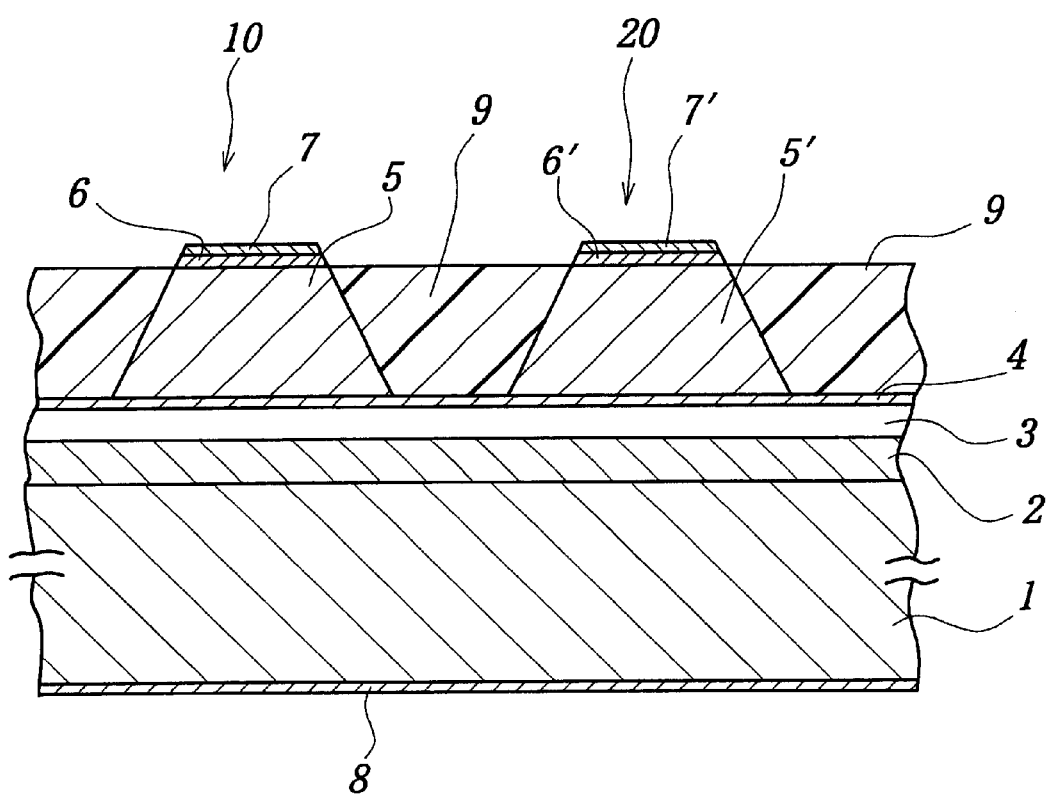
FIG. 2 is a cross sectional view cut along a line perpendicular to the propagating direction of a light wave in the optical wavelength converter shown in FIG. 1.

FIGS. 1 and 2 show a first embodiment of the optical wavelength converter according to the invention. FIG. 1 is a schematic perspective view and FIG. 2 is a cross sectional view depicting a portion including semiconductor optical amplifiers. In the present embodiment, an input optical signal consisting of a first light wave having a first wavelength $\lambda_1$ of 1.549 µm is converted into an output optical signal consisting of a second light wave having a second wavelength $\lambda_2$ of 1.551 µm. In the present embodiment, the optical wavelength converter comprises first and second active waveguides composed of first and second semiconductor optical amplifiers 10 and 20, respectively formed on a same semiconductor substrate.

At first, an n-InP substrate 1 is prepared, and semiconductor optical amplifiers constituting the waveguides are formed on this semiconductor substrate side by side with a small distance. The substrate 1 has a thickness of 100 µm and has an impurity concentration of $2 \times 10^{18}$ atoms/cm$^3$. The substrate 1 contains sulfur as an N-type impurity. A first cladding layer 2 is formed on the substrate 1 with a thickness of 0.4 µm, said first cladding layer being made of n-InP having an impurity concentration of $5 \times 10^{17}$ atoms/cm$^3$. On this first cladding layer 2 is formed an active layer 3 made of i-InGaAsP (1.55 µm), said active layer having a thickness of 0.2 µm. An etching stopper layer 4 is formed on the active layer 3 with a thickness of 0.02 µm, said etching stopper layer being made of InGaAsP (1.25 µm). Second and third cladding layers 5 and 5' are formed on the etching stopper layer 4 with a thickness of 1 µm, said second and third cladding layers being made of p-InP having an impurity concentration of $5 \times 10^{17}$ atoms/cm$^3$. The P-type impurity may be Zn. On the second and third cladding layers 5 and 5', are formed first and second cap layers 6 and 6', respectively with a thickness of 0.1 µm, said cap layers having an impurity concentration of $2 \times 10^{19}$ atoms/cm$^3$. On the first and second cap layers 6 and 6' are further formed first and second electrodes 7 and 7', respectively. Finally, a third electrode 8 is formed on an opposite surface of the substrate 1, said first, second and third electrodes being made of Ti—Au.

Now a method of manufacturing the above mentioned wavelength converter will be explained briefly. After forming the first cladding layer 2, active layer 3 and etching stopper layer 4 are successively deposited on the substrate 1, a p-InP layer constituting the second and third cladding layers 5 and 5' is uniformly formed on the etching stopper layer 4. Then, this p-InP layer is selectively removed by photolithography using the etching stopper layer as a stopper for etching to form the second and third cladding layers 5 and 5' in the shape of ridge. Next, an electrically insulating polyimide 9 is deposited on the whole surface such that depressions are filled with the polyimide. Then, the ashing is performed to remove portions of the parts of the polyimide on the second and third cladding layers 5 and 5'. After forming the first and second cap layers 6 and 6' on the exposed surfaces of the second and third cladding layers 5 and 5', respectively, the first and second electrode layers 7 and 7' are formed on the first and second cap layers, respectively. Finally the third electrode 8 is formed on the rear surface of the substrate 1. In this manner, the first semiconductor optical amplifier containing a first waveguide 10 is constituted by the semiconductor substrate 1, first cladding layer 2, active layer 3, second cladding layer 5, and first and second electrodes 7 and 8, and at the same time the second semiconductor optical amplifier containing a second waveguide 20 is constituted by the first cladding layer 2, active layer 3, third cladding layer 5', and second and third electrodes 7' and 8. These semiconductor optical amplifiers are separated from each other by such a distance that these semiconductor optical amplifiers are optically coupled and evanescent light of a light wave propagating along one of the first and second waveguides extends into the other waveguide. This distance between the first and second waveguides is preferably set to a value within a range from $0.5\ \lambda_2$ to $5\ \lambda_2$. In the present embodiment, the first and second waveguides 10 and 20 are separated from each other by a distance of 3 µm. Further, first and second variable DC current sources (not shown) are connected across the first and third electrodes 7 and 8, and across the second and third electrodes 7' and 8, respectively. By adjusting the bias currents, it is possible to control the amount of the injected carrier density, and therefore the propagation constants of the waveguides can be adjusted independently.

The waveguide length L of the first and second waveguides 10 and 20 is set to be substantially identical with a coupling length at which the transition of optical power between these waveguides becomes maximum. Furthermore, the propagation constants of these semiconductor optical amplifiers are set to be substantially identical with each other.

An input side optical fiber (not shown) is arranged to face a light incident end face of the first semiconductor optical amplifier 10 and an output side optical fiber (not shown) is arranged to face a light exit end face of the second semiconductor optical amplifier 20.

Now the operation of the optical wavelength converter will be explained. The optical signal composed of the input light wave having the first wavelength $\lambda_1$ and an amplitude modulated in accordance with a data signal and the second light wave having the second wavelength $\lambda_2$ and a constant amplitude are made incident upon the first semiconductor optical amplifier 10 by means of the input side optical fiber. The first light wave constituting the input optical signal has a high level signal portion whose power is higher than that of the second light wave and a low level signal portion having a zero power. Therefore, the optical power having the wavelengths $\lambda_1$ and $\lambda_2$ and the optical power having the wavelength $\lambda_2$ propagate successively through the first semiconductor optical amplifier 10. According to the invention, the first and second semiconductor optical amplifiers 10 and 20 are constructed such that a propagation constant difference $\Delta\beta$ between the first and the second semiconductor optical amplifiers 10 and 20 when only the optical power having the second wavelength $\lambda_2$ propagates along the first semiconductor optical amplifier 10 is smaller than a propagation constant difference $\Delta\beta$ between the first and the second semiconductor optical amplifiers when the optical power having the first and second wavelengths $\lambda_1$ and $\lambda_2$ propagates along the first semiconductor optical amplifier 10. By constructing the optical wavelength converter in this manner, when only the optical power having the second wavelength $\lambda_2$ is made incident upon the first semiconductor optical amplifier 10, the optical coupling is established between the first and second semi-conductor optical amplifiers 10 and 20 such that the second light wave having the second wavelength 2 and an amplified amplitude transits into the second semiconductor optical amplifier 20. In this manner, the amplified second light wave having the second wavelength $\lambda_2$ exits from the second semiconductor optical amplifier 20. When the optical power having the first and second wavelengths $\lambda_1$ and $\lambda_2$ propagates through the first semiconductor optical amplifier 10, the first and second semiconductor optical amplifiers 10 and 20 are de-coupled from each other, and therefore the amount of the optical power transmitting from the first semiconductor optical amplifier 10 into the second semiconductor optical amplifier 20 is materially reduced and an optical power output emanating from the second semiconductor optical amplifier 20 is materially reduced. In this manner, from the output end face of the second semiconductor optical amplifier 20, the inverted optical pulse signal exits.

Figure 3:
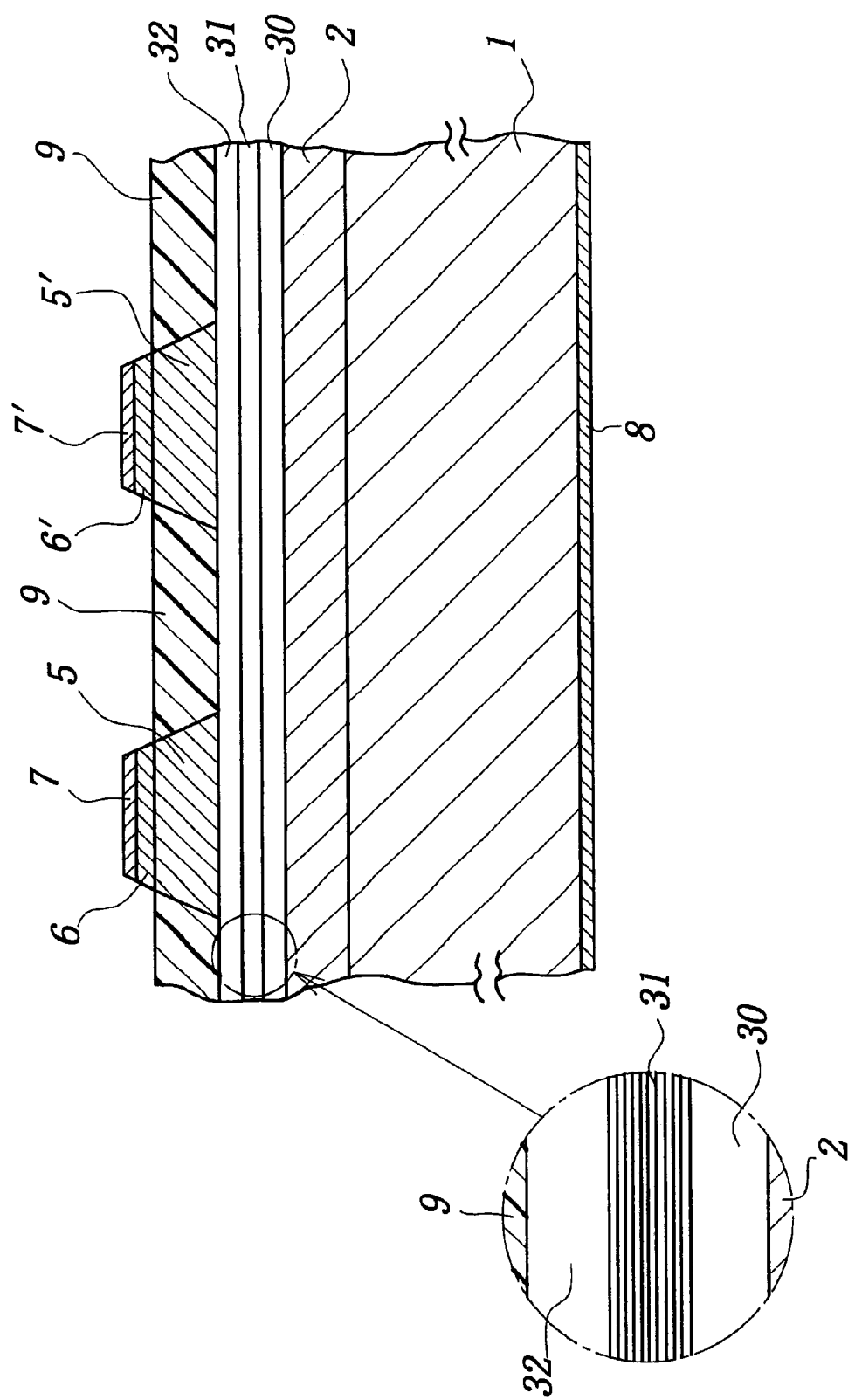
FIG. 3 is a cross sectional view illustrating another embodiment of the optical wavelength converter according to the invention.

FIG. 3 is a cross sectional view showing a second embodiment of the optical wavelength converter according to the invention. In this embodiment, the active layer is formed by a quantum well structure. In this embodiment, portions similar to those of the previous embodiment are denoted by the same reference numerals used in FIGS. 1 and 2. On the first cladding layer 2, there is formed a first optical confinement layer 30 made of InGaAsP ($\lambda$=1.55 $\mu$m) and having a thickness of 200 nm. Next, a quantum well structure layer 31 is formed on the first optical confinement layer 30, said quantum well structure layer being constructed by five quantum well layers of InGaAsP ($\lambda$=1.75 $\mu$m) having a thickness of 10 nm and five barrier layers of InGaAsP ($\lambda$=1.25 $\mu$m) having a thickness of 10 nm, said quantum well layers and barrier layers being stacked alternately. On the quantum well structure layer 31, is further formed a second optical confinement layer 32 made of InGaAsP ($\lambda$=1.25 $\mu$m) and having a thickness of 200 nm. It should be noted that such a quantum well structure has been known in the art, and a further detailed explanation is dispensed with.

The present invention is not limited to the above explained embodiments, but many modifications and alternations may be conceived by a person skilled in the art within the scope of the invention. The semiconductor optical amplifier may be made of various composition semiconductor materials such as GaAlAs/GaAs series, InGaAlAs/InP series and InGaAs/GaAs series other than InGaAs/InP series.

Furthermore, in the above embodiments, after forming the two ridges of the second and third cladding layers 5 and 5', the space between these ridges is filled with the insulating material, but according to the invention, the ridges may be formed by selectively converting portions of the cladding layer into the electrically insulating areas by selectively injecting protons into said selected portions.

In the above explanation, the present invention is applied to the optical wavelength converter. However, the principle of the present invention may be applied to active directional optical couplers and optical switching elements, in which the second light wave impinging upon the first waveguide is selectively transferred into the second waveguide in dependence upon the first input optical signal.

What is claimed is:

1. An optical wavelength converter for converting an input optical pulse signal having a first wavelength into an output optical pulse signal having a second wavelength which is different from said first wavelength comprising:

a first waveguide constructed by an active waveguide and receiving the input optical pulse signal having the first wavelength, a propagation constant of said first waveguide being changed in accordance with an optical power of the input optical pulse signal; and a second waveguide arranged in parallel with said first waveguide to partially overlap with said first waveguide such that the first and second waveguides are optically coupled with each other to such an extent that evanescent light of light propagating along one of the first and second waveguides extends into the other waveguide;

wherein said first and second waveguides have a waveguide length L which is substantially equal to a coupling length at which a power transition of an optical signal propagating along the first waveguide into the second waveguide becomes maximum; and said first and second waveguides are constructed such that a propagation constant difference $\Delta\beta$ between the first and the second waveguides in a case that only an optical signal having a second wavelength propagates along said first waveguide is smaller than a propagation constant difference $\Delta\beta$ between the first and the second waveguides when both the input optical signal having the first wavelength and the optical signal having the second wavelength propagate along the first waveguide.

2. An optical wavelength converter according to claim 1, wherein said propagation constant difference $\Delta\beta$ between the first and the second waveguides in a case that only the optical signal having the second wavelength propagates along said first waveguide is set to substantially zero, and said waveguide length L of the waveguides is substantially equal to a complete coupling length.

3. An optical wavelength converter according to claim 1, wherein said active waveguide is constructed by a semiconductor optical amplifier in which a propagation constant is changed in accordance with the optical power of an input optical signal.

4. An optical wavelength converter according to claim 3, wherein both of said first and second waveguides are constructed by semiconductor optical amplifiers formed on a same semiconductor substrate.

5. An optical wavelength converter according to claim 4, wherein each of the first and second semiconductor optical amplifiers is formed to have the waveguide length L within a range from 100 $\mu$m to 5 mm.

6. An optical wavelength converter according to claim 4, wherein a distance between the first and second semiconductor optical amplifiers is set to a value within a range from 0.5 to 5 times said second wavelength.

7. An optical wavelength converter according to claim 4, comprising a semiconductor substrate of one conductivity type, a first cladding layer formed on the substrate, an active layer formed on the first cladding layer and being excited with light having said second wavelength, second and third cladding layers of the opposite conductivity type formed on the active layer separated from each other by means of an insulating layer, first and second electrodes formed on the second and third cladding layers, respectively, and a third electrode formed on a surface of said substrate opposite to the surface on which said active layer and said cladding layers are formed, wherein said first semiconductor optical amplifier is constituted by said semiconductor substrate, first cladding layer, active layer, second cladding layer, and first and third electrodes, and said second semiconductor optical amplifier is constituted by said semiconductor substrate, first cladding layer, active layer, third cladding layer, and second and third electrodes.

8. An optical wavelength converter according to claim 7, wherein said semiconductor substrate is made of n-InP, said first cladding layer is made of n-InP, said active layer is made of i-InGaAsP, said second and third cladding layers are made of p-InP, and said first, second and third electrodes are made of Ti—Au.

9. An optical wavelength converter according to claim 7, wherein said active layer comprises a super lattice structure including alternately stacked quantum well layers made of InGaAsP ($\lambda$=1.75 µm) and barrier layers made of InGaAsP ($\lambda$=1.25 µm), a first optical confinement layer made of InGaAsP ($\lambda$=1.25 µm) formed on one side of the super lattice structure, and a second optical confinement layer made of InGaAsP ($\lambda$=1.55 µm) formed on the other side of the super lattice structure.

10. An optical wavelength converter according to claim 7, wherein a variable DC bias current source is connected across said first and third electrodes of said first semiconductor optical amplifier such that a propagation constant difference between the first and second semiconductor optical amplifiers can be adjusted.

11. An optical wavelength converter according to claim 10, wherein a second variable DC bias current source is connected across said second and third electrodes.

* * * * *